United States Patent
Karlstrom et al.

(10) Patent No.: US 6,239,388 B1
(45) Date of Patent: *May 29, 2001

(54) DEVICE FOR REDUCING THE TIME FOR MEASURING ON A CABLE

(75) Inventors: Bo Karlstrom, Norrkoping; Per Ljung, Hultsfred; Frank Pettersson, Kolmarden; Thomas Eklund, Soderkoping; Hakan Hallberg, Vimmerby; Tommy Andersson, Simrishamn, all of (SE)

(73) Assignee: Telia AB, Farsta (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/147,524
(22) PCT Filed: Jul. 3, 1997
(86) PCT No.: PCT/SE97/01199
§ 371 Date: Apr. 7, 1999
§ 102(e) Date: Apr. 7, 1999
(87) PCT Pub. No.: WO98/02755
PCT Pub. Date: Jan. 22, 1998

(30) Foreign Application Priority Data

Jul. 15, 1996 (SE) .................................................. 9602778

(51) Int. Cl.⁷ ................................. H01B 7/14; H02G 3/00
(52) U.S. Cl. .......................... 174/705; 174/73.1; 174/135
(58) Field of Search .................................. 174/705, 74 R, 174/74 A, 73.1, 79, 158 F, 135

(56) References Cited

U.S. PATENT DOCUMENTS

| | | | |
|---|---|---|---|
| 2,155,650 | * 4/1939 | Gilbert | 174/70 S |
| 3,349,163 | * 10/1967 | Rocton | 174/70 S |
| 3,840,808 | * 10/1974 | Liebermann | 324/127 |
| 4,684,211 | * 8/1987 | Weber et al. | 350/96.2 |
| 4,687,365 | * 8/1987 | Promersberger | 403/2 |
| 4,691,988 | * 9/1987 | Tremblay et al. | 350/96.23 |
| 4,847,447 | 7/1989 | Eiswirth et al. . | |
| 5,027,864 | * 7/1991 | Conti et al. | 138/177 |
| 5,039,196 | * 8/1991 | Nilsson | 385/136 |
| 5,129,027 | * 7/1992 | Boero et al. | 385/104 |
| 5,133,583 | * 7/1992 | Wagman et al. | 294/86.42 |
| 5,610,512 | * 3/1997 | Selcuk | 324/127 |
| 5,731,517 | * 3/1998 | Ma et al. | 73/152.01 |
| 5,792,987 | * 8/1998 | Dong et al. | 174/74 A |

* cited by examiner

*Primary Examiner*—Dean A. Reichard
*Assistant Examiner*—W. David Walkenhorst
(74) *Attorney, Agent, or Firm*—Oblon, Spivak, McClelland, Maier & Neustadt, P.C.

(57) ABSTRACT

A splicing device is provided for being fastened to one end of a cable wherein fibers/wires in the cable are connectable to the device. Further, the cable sheathing is brased to the device by a tightening procedure. The connection of the device to the cable is made under a controlled environmental condition, for instance, in a factory, during transport to the place of cable laying, or the like. The device is designed in a watertight design wherein the cable is allowed to be lowered down into water without further measures needing to be taken. The device further can be opened, in which connections for the measuring equipment are accessible. Measuring of the cable after that can be performed. The device is usable, for instance, in the laying of a submarine cable from cable ships. The device includes a splicing part and a measurement connection part. In the splicing part of the device, the fibers/wires of the cable are connected. The fibers/wires also are connected with the measuring part in which a connection block is arranged. At the place of delivery, the measuring part is opened and the measuring instrument is connected to the device such that the quality or condition of the cable can be determined.

16 Claims, 1 Drawing Sheet

DEVICE FOR REDUCING THE TIME FOR MEASURING ON A CABLE

BACKGROUND OF THE INVENTION

1. Field of the Invention

The present invention relates to measuring a cable in connection with cable laying. The invention especially relates to laying of submarine cables. The invention especially relates to fiber optical cables but is also applicable to electrical cables. The invention further relates to a splicing device for utilization at cable pulling where strong forces are involved.

2. Discussion of the Background

In the laying of cables there is a requirement that a certificate regarding the quality of the cable be issued. This is accomplished by an end of the cable that is located and "moored" on land being opened and the ends of the fibers/wires being connected to measuring instrument. After the connection current measurements are performed and the quality of the cable is determined, a guaranteed electrical quality check of the cable can be obtained once the measurements are performed. To perform cable pullings it is previously known to fasten different types of hauling ropes to the cables before the pulling is started. It is further known to connect the so called single-ended cable grips to the end of the cable and fasten the hauling rope to this. The single-ended cable grip is designed in such a way that it upon pulling tightens round the sheath of the cable. An acceptable hold is achieved as long as the quality of strength of the single-ended cable grips is not exceeded. Upon pulling of cables in harder environments such as laying of submarine cable, the strains can be considerable due to currents and other circumstances.

In laying of submarine cables there is a need for measuring the cable at the "hand over"-point on land. The technology which is utilized implies that measuring instrument is connected to the cable when one of its ends has been "moored" on land. The procedure is time-consuming and expensive since the cable ship with crew is principally inactive during the measuring. Upon laying of submarine cable, steps shall further be taken to prevent water from coming into the cable, which reduces or spoils the cable's fit for use. Upon pulling of the cable it is further necessary that a hauling rope be fastened to the cable. For this purpose there are different arrangements, for instance single-ended cable grips, which can be threaded on to the end of the cable. These single-ended cable grips, however, are intended for pulling of cable in ducts on land where there are no problems with the humidity. Upon laying of cables in sea/lakes and waterlogged areas, the tensile strain is in certain cases considerable. One cannot take for granted that it is possible to utilize single-ended cable grips on these occasions.

SUMMARY OF THE INVENTION

The present invention relates to a device which can be used for instance in laying of submarine cable from cable ships. The device includes a splicing section, and a section for connection of measuring device. In the splicing section the fibers/wires of the cable are connected. The fibers/wires are further connected to the measurement section, in which a contact unit for connections is arranged. At the "place of deliver" the measurement connection section is opened, at which place a measuring instrument can be connected and the quality of the cable can be determined.

The invention relates to a device for delivery of cable, which cable includes a number of fibers/wires. The cable is mounted in one in the device arranged splicing device. The fibers/wires are further connected in the splicing device. A connection device for measuring equipment is connected to the splicing device. The fibers/wires are connected to the splicing device.

The invention consequently relates to a device for reduction of the measuring time needed at "delivery" of the cable at its end point. For this purpose the fibers/wires of the cable are connected to the device. The connection is made pre-assembled. To the device a measuring equipment further can be connected. By reading of the measuring equipment after that the measuring of the fibers/wires is made, time is saved with respect to the arranging of the cable and connection of the fibers/wires to the measuring device.

The device further is constructed with a watertight design which resists liquids and/or gases. Such further resists compressive stress. The device consequently makes it possible to lower down the end of the cable into waterlogged areas without the cable being effected. In the device fastening devices are further arranged, to which a hauling rope, wire or the like can be connected. By means of the hauling rope the cable subsequently can be pulled in different environments such as sea/lakes, swamps, ducts, etc.

The device further can be opened for access to connection device for measuring equipment. The measuring devices can be of different kinds, for instance contact units which have been adapted to the characteristics of the fibers/wires.

When the device has fulfilled its purpose, it is removed from the cable, to be reused on another occasion. The connection of the device can be made on the one hand at the manufacturing of the cable, and on the other hand, during transport to the location of cable laying. The transport can for instance relate to a trip in a cable laying ship to a point where the laying of the cable shall start, or during laying of cable to the end which is left on the ship.

The fibers/wires of the cable can be optical or electrical and principally intended for transmission of information. The device includes a splicing box to which the fibers/wires of the cable are connected and in which the tightening devices for the holding of the cable have been arranged. A measurement connection device is further arranged in the device in line with the splicing box. The measurement connection device includes a connection contact unit for connection of the measuring equipment.

The fastening device and the device are further arranged to allow tensile strains of at least 10,000 kp. With present cables and conditions at sea are in many cases required that both cable and pulling devices shall carry strains of at least 40,000 kp.

The device is utilized at laying of cables from ships. Further, the arrangement shall allow that end of the cable in its entirety to be lowered down into the water for pulling to land. The device further can be used for pulling in waterlogged areas or under other special conditions where special demands are required.

The present invention permits measurement connections to be made to a cable before the cable is laid. In laying of submarine cable, consequently, connection of the measuring equipment to the cable can be prepared while at sea on the cable ship, or by utilization of other transport means, or, alternatively in manufacturing of the cable. The construction further allows enclosure of the end of the cable to which the measuring equipment shall be connected. By the device being made with a watertight construction the cable can be allowed to be lowered down into water during the pulling of the cable. The incorporation of a hold in the ship for hauling rope, wire or the like, further allows the device to be used for pulling of said cable to the delivery point on land. The encapsulation consequently is waterproof and thus the cable can be lowered down into the sea from the ship and, after that, by means of a rope, wire or the like can be pulled ashore. The effective time the ship can be utilized for laying of cable is increased as well because the measuring time is reduced corresponding to the time the connection of the measurement connection requires. The invention also can be used in connection with other laying of cables, for instance in ducts where the pre-assembling of the measurement connection can be time-saving. The construction of the device further allows that the hauling rope, or corresponding, easily can be fastened to the device for pulling of cable in different connections. The construction has the further advantage that the connection of the fibers in the cable to the connection device for the measuring equipment can be made in an environment which is "operation friendly", and not under uncontrolled environmental conditions. This guarantees that the measuring results will be correct. The invention consequently gives a reduces time at the measuring of the cable, and the time for transport of the cable to the end of the laying of the cable can be effectively utilized.

DETAILED DESCRIPTION OF THE PREFERRED EMBODIMENTS

Figure 1:
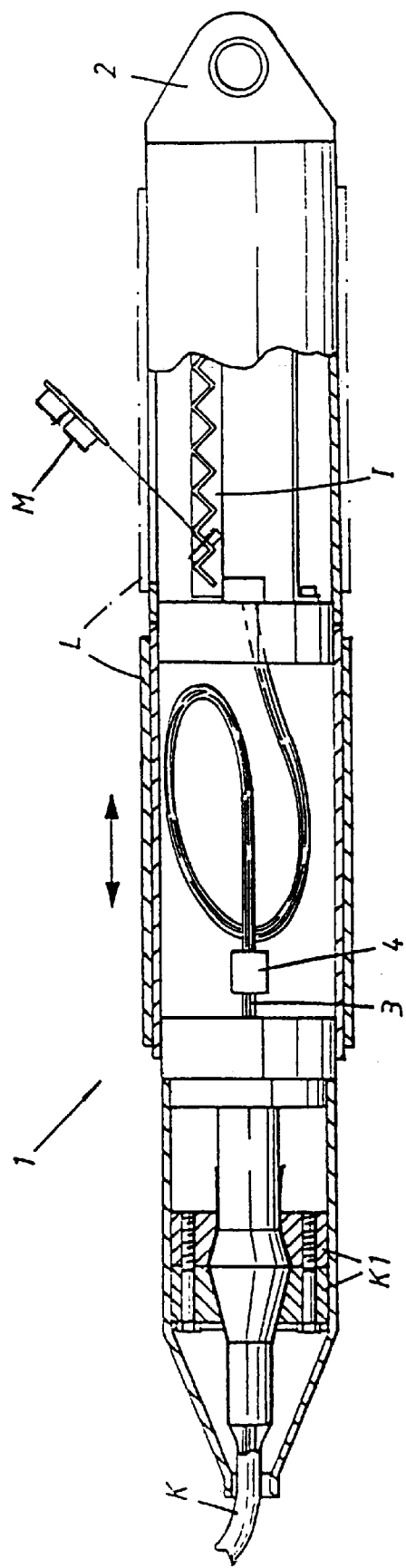
FIG. 1 shows the embodiment of the invention in a submarine embodiment.

In the following summary the invention is described on the basis of the figures and in the terms in them. The present invention relates to a device which is fastened to one of the ends of a cable. The fibers/wires in the cable are connected in the device. Further, the sheath of the cable is braced to the device by a tightening procedure. The connection of the device to the cable occurs under controlled environmental conditions, for instance at a factory, during transport to the place of laying, or the like. The device is made with a watertight design wherein the cable is allowed to be lowered down into water without further measures needing to be taken. The device further can be opened, whereupon connections for measuring equipment are accessible. Measuring of the cable subsequently can occur. The invention relates to a device which can be used, for instance, for laying of submarine cable from a cable ship. The device includes a splicing section located adjacent the cable, and a measurement connection section. In the splicing section the fibers/wires of the cable are connected. The fibers/wires are further connected to the measurement section in which a connection contact unit is arranged. At the place of delivery the measurement connection section is opened, at which location the measurement instrument can be connected and the quality of the condition of the cable can be determined. The invention relates to a cable which includes a number of fibers/wires. The cable is mounted in one in the splicing devices. A connection device for measuring equipment is connected to the splicing device. The fibers/wires are connected to the splicing device.

A cable, K, can be laid in sea/lake from ship, in ducts, through rough terrain, for instance, marshy areas. In connection with transport of the cable, in connection with the fetching of cable from stock, at the manufacturing of the cable etc, a device, 1, is mounted to at least one of the ends of the cable. The device includes a fastening device, 2, which for instance is designed as a loop. To the fastening device a rope, wire, cable, etc is connected. The rope, wire, cable, etc. is brought to the place where the cable, K, shall have one of its end points. Upon laying in sea/lake or waterlogged areas, the end of the cable is allowed to be under the surface of the water. This is because the device, 1, is waterproof and that the fastening of the cable to the device is sealed in a watertight manner. Upon the bringing ashore of cable, K, from a ship, the cable is lowered down into the water and the rope, wire, cable, etc is brought ashore with a smaller landing boat, for instance, a dingy belonging to the ship. The cable is subsequently pulled to the intended place by hand or by winches of different kinds etc. Because the fastening device, K1, may be subject to strong forces, for instance currents, extreme depths etc, all of the parts of the system must endure forces amounting to at least 40,000 kp. Strong forces also shall be applicable to the system upon pulling of the cable through rough terrain, type marshes. In these cases the cable is normally not subject to any forces from streaming water, but earth layers through which the cable is pulled exert a "sucking" force which effects a pulling action on tensile force on the cable. In this latter case, means of assistance may be required to be arranged along the path of the cable pulling to secure that the cable pulling will succeed, and that the cable will not be damaged. A means of assistance on the one hand can be used to prevent the cable from sinking down into the mud, and on the other be intended to give pulling aid to the cable.

When the cable end has reached its final destination, the device, I, is opened by an opening device, L, which is stable in a longitudinal direction of the connection device 1 as shown in FIG. 1, at which connection device I for the measuring device, M, is exposed via opening O in a side wall portion of the device 1. The connection devices, which consist of connection strip, contact unit or the like, are contacted to the measuring device, after which the different fibers/wires of the cable are measured. The measurings are entered in books and constitute a confirmation of the quality of the cable. The device afterwards is removed from the cable by the latter being cut with, for instance, a sawing device. The removal of the device, 1, can be made immediately, or on a later occasion, for instance in connection with splicing with a cable from the opposite direction. No matter when the device is removed from the cable, the rest of the cable is removed from the device either during transport to next laying place for new cable, or at central place. The device afterwards can be used again for mounting on ne cable. It is thus possible to connect the device, 1, under controlled conditions. This will increase the probability that the cable is handed over in best condition, at the same time as the work with the measuring of the quality of the cable is reduced to a minimum. In connection with laying of submarine cable it is necessary that the cable laying ship does not wait for the performance of the measuring, but has the possibility of heading towards the next mission while the measurings are completed. When the measurings have been completed, the measuring staff can by fast boat go to the ship, such that expensive time can be saved.

The device, 1, is arranged with a fastening device, K1, which tightens round the sheathing and/or the reinforcement of the cable sheathing. For the fastening the cable core is separated from the sheathing parts. The fastening device, K1, can be designed in different ways, one of which is that the sheathing is laid over a back, over which two against each other conical rings are tightened. The rings are fastened against each other with bolting or the like. The fibers/wires, 3 of the cable are connected in usual way to connection fibers/wires 4 in the device. The fibers/wires, 3, are led via a hollow in the part of the device where the main part of the connection fibers/wires have been placed. The connection fibers/wires are arranged in loop to make it easy to take out in connection with the splicing work. The other ends of the connection fibers/wires are connected to connection block or the like. Over this part of the device there is an opening device arranged, which is opened in connection with the measuring of the cable. In the front end of the device there is also arranged the fastening device. This consists, for instance, of a loop to which hauling rope or the like can be fastened in connection with the pulling of the end of the cable to its destination. The invention is not restricted to the above described embodiment but may be subject to modifications within the fine of the underlying patent claims and idea of invention.

What is claimed is:

1. A splicing assembly for the reduction of measuring time required upon delivery of a cable at end points thereof, which comprises:

a splicing device having a side wall;

a plurality of fibers or wires of the cable which are pre-assembled in and connectable to the splicing device;

a measuring device which is connected to the splicing device, the measuring device measuring the condition of the fibers/wires of the cable such that the measuring time comprises the time needed for connection of the measuring device to the splicing device and for performing measuring of the condition of the fibers/wires of the cable a connection device for being connected to said measuring device, said side wall of said splicing device having an opening formed therein and an openable device slidably movable in a longitudinal direction of the splicing device so as to selectively open and close the opening, the measuring device being connectable to the connection device upon opening of the opening by said openable device.

2. A splicing assembly according to claim 1, wherein the splicing device comprises one of a watertight device and a gastight device.

3. A splicing assembly according to claim 2, wherein the connection device resists stretching strains of at least 10,000 kp.

4. A splicing assembly according to claim 1, wherein the splicing assembly comprises an assembly resistant to pressure stresses.

5. A splicing assembly according to claim 1, which comprises a fastening device mounted to the connection device.

6. A splicing assembly according to claim 1, wherein the splicing device is adapted for cable pulling in bodies of water, wetlands or ducts.

7. A splicing assembly according to claim 1, wherein the connection device is removable from the cable when the measuring by the measuring device has been finished.

8. A splicing assembly according to claim 1, wherein the measuring device comprises a reusable measuring device.

9. A splicing assembly according to claim 1, wherein the connection device is connectable to the fibers or wires upon manufacturing of the cable or during transport of the cable to cable laying location.

10. A splicing assembly according to claim 1, wherein the fibers or wires comprise information transmission fibers/wires.

11. A splicing assembly according to claim 1, wherein the fibers comprise optical fibers.

12. A splicing assembly according to claim 1, wherein the wires comprise electrical wires.

13. A splicing assembly according to claim 1, wherein the connection device comprises a measurement connection device, which includes sockets for connection of the measuring device thereto.

14. A splicing assembly according to claim 1, wherein the cable is positionable in a body of water from a cable laying ship.

15. A splicing assembly according to claim 1, wherein the cable is lowerable into a body of water and the connection device is connected to an end of the cable, one of a rope and wire is utilized for pulling the cable on to land to a delivery point, and wherein inspection of the cable is performable on land.

16. A splicing assembly according to claim 1, which comprises a fastening device for hauling one of a rope and a wire.

* * * * *

UNITED STATES PATENT AND TRADEMARK OFFICE
CERTIFICATE OF CORRECTION

PATENT NO. : 6,239,388 B1
DATED : May 29, 2001
INVENTOR(S) : Karlstrom et al.

It is certified that error appears in the above-identified patent and that said Letters Patent is hereby corrected as shown below:

<u>Title page,</u>
Item [54], and the top of Column 1, the Title of Invention should be:
-- [54] SPLICING DEVICE FOR REDUCING THE TIME REQUIRED FOR PERFORMING MEASUREMENTS ON A CABLE --

Signed and Sealed this

Twenty-sixth Day of March, 2002

Attest:

*Attesting Officer*

JAMES E. ROGAN
*Director of the United States Patent and Trademark Office*